(12) United States Patent
Telecco

(10) Patent No.: US 6,700,415 B2
(45) Date of Patent: *Mar. 2, 2004

(54) SENSE AMPLIFIER WITH CONFIGURABLE VOLTAGE SWING CONTROL

(75) Inventor: Nicola Telecco, Santa Clara, CA (US)

(73) Assignee: Atmel Corporation, San Jose, CA (US)

( * ) Notice: Subject to any disclaimer, the term of this patent is extended or adjusted under 35 U.S.C. 154(b) by 50 days.

This patent is subject to a terminal disclaimer.

(21) Appl. No.: 10/267,339

(22) Filed: Oct. 9, 2002

(65) Prior Publication Data

US 2003/0025532 A1 Feb. 6, 2003

Related U.S. Application Data

(63) Continuation-in-part of application No. 09/877,353, filed on Jun. 7, 2001, now Pat. No. 6,518,798.

(51) Int. Cl.[7] .............................................. G01K 15/00
(52) U.S. Cl. ........................................ 327/54; 327/55
(58) Field of Search ............................. 327/51, 52, 54, 327/55, 57, 215, 218, 208, 210, 50; 365/203, 205, 207

(56) References Cited

U.S. PATENT DOCUMENTS

| | | | | |
|---|---|---|---|---|
| 5,155,397 A | * | 10/1992 | Fassino et al. ................. | 327/54 |
| 5,426,755 A | * | 6/1995 | Yokouchi et al. .............. | 327/57 |
| 5,525,917 A | | 6/1996 | Wong et al. ................... | 327/51 |
| 5,525,919 A | | 6/1996 | Phelan ......................... | 327/52 |
| 5,552,728 A | * | 9/1996 | Lin .............................. | 327/57 |
| 5,939,903 A | * | 8/1999 | Lin .............................. | 327/57 |
| 6,031,775 A | | 2/2000 | Chang et al. ................. | 365/205 |
| 6,130,560 A | * | 10/2000 | Sato ............................ | 327/57 |
| 6,518,798 B2 | * | 2/2003 | Telecco ........................ | 327/54 |

* cited by examiner

*Primary Examiner*—Long Nguyen
(74) *Attorney, Agent, or Firm*—Thomas Schneck; Mark Protsik; Nissa Strottman

(57) ABSTRACT

A sense amplifier that is configurable to operate in two modes in order to control a voltage swing on the sense amplifier output. The sense amplifier has two feedback paths including a first feedback path having a transistor with a fast response time in order to allow the circuit to operate as fast as possible, and a second feedback path for providing voltage swing control. In the first operating mode, the "turbo" mode, both feedback paths are in operation to provide a higher margin of swing control, thus higher sensing speed. In the second operating mode, the "non-turbo" mode, only the first feedback path is in operation which allows for greater stability and a reduction in power consumption.

23 Claims, 3 Drawing Sheets

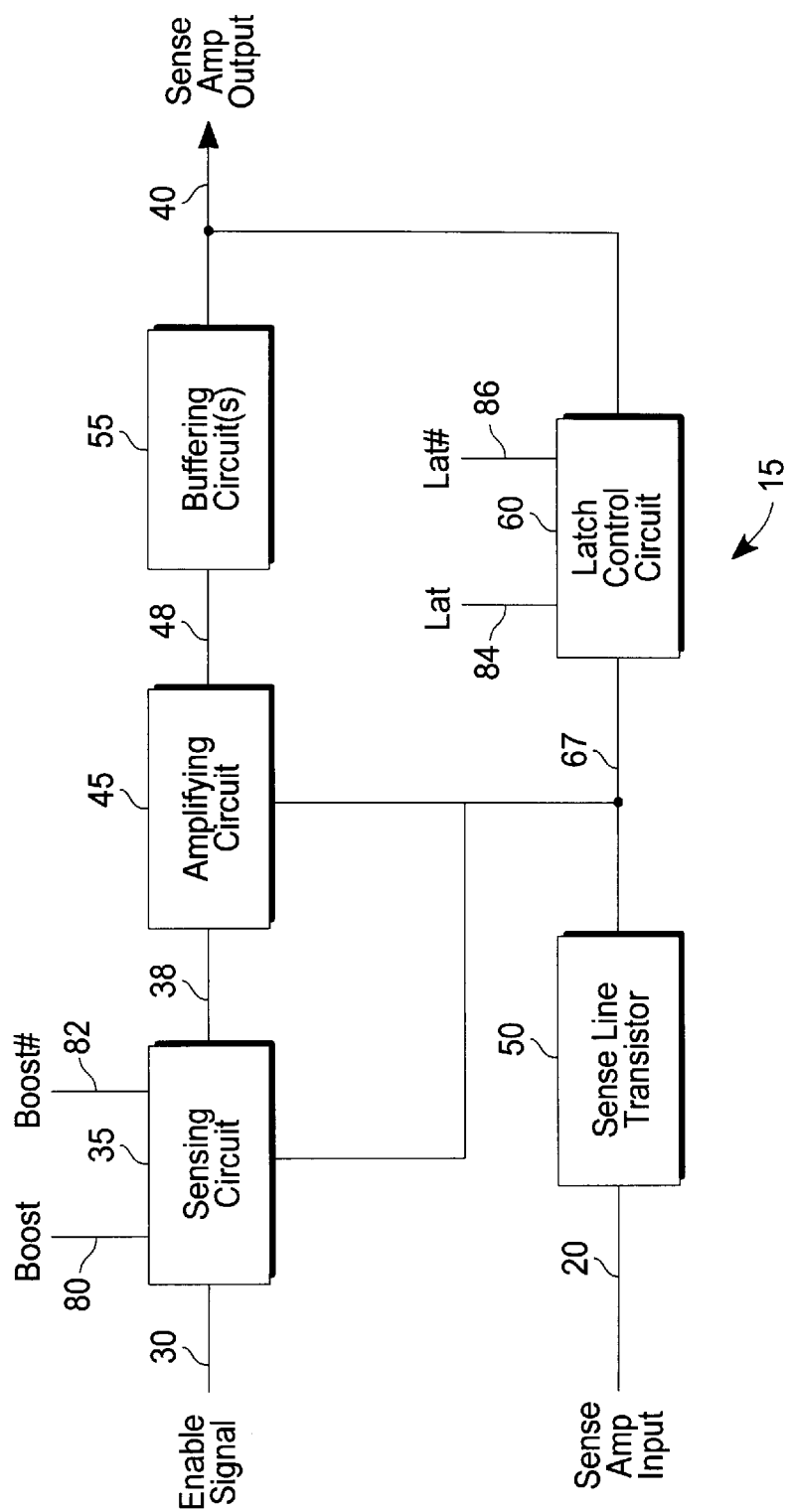
FIG._1

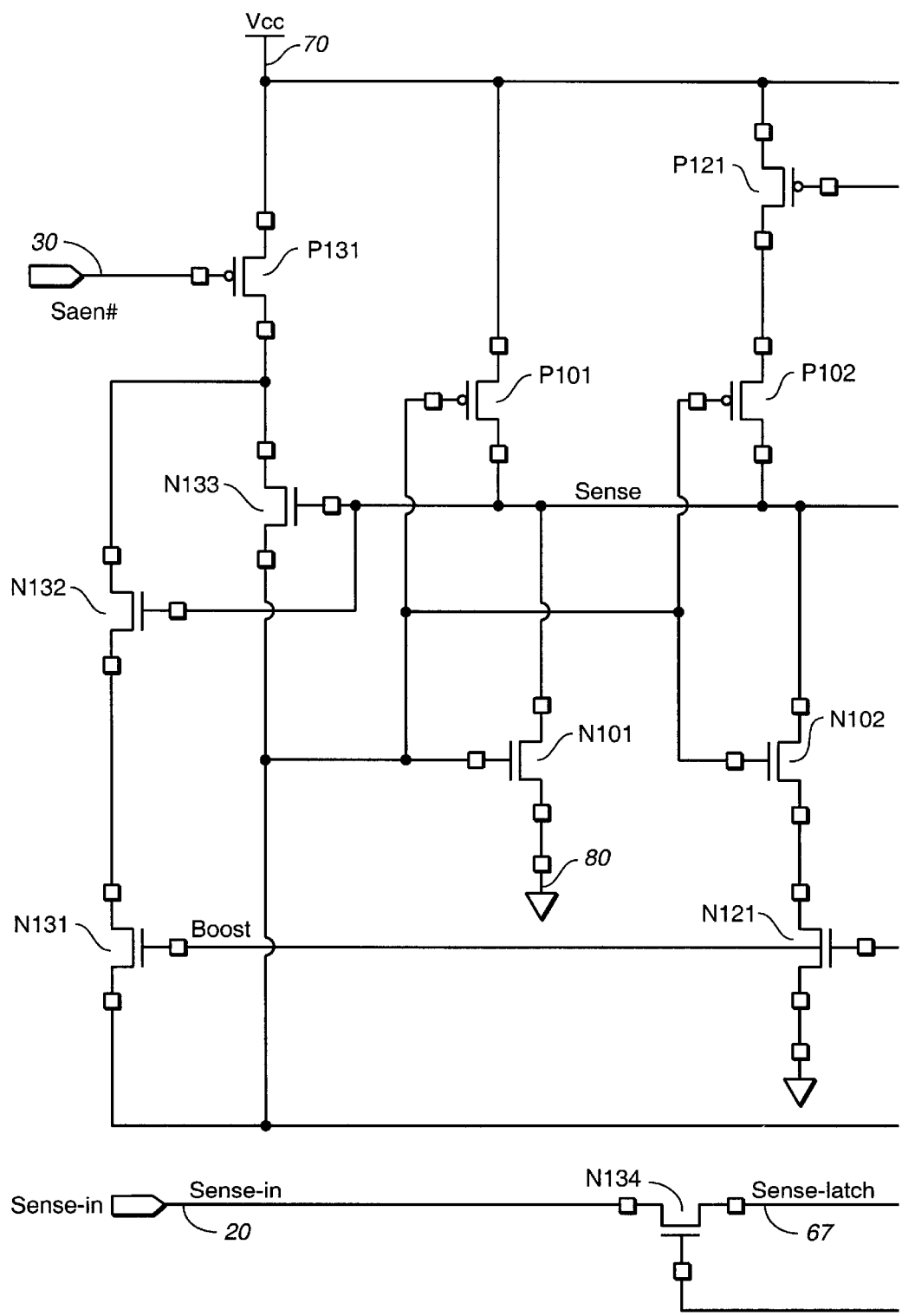
FIG._2A

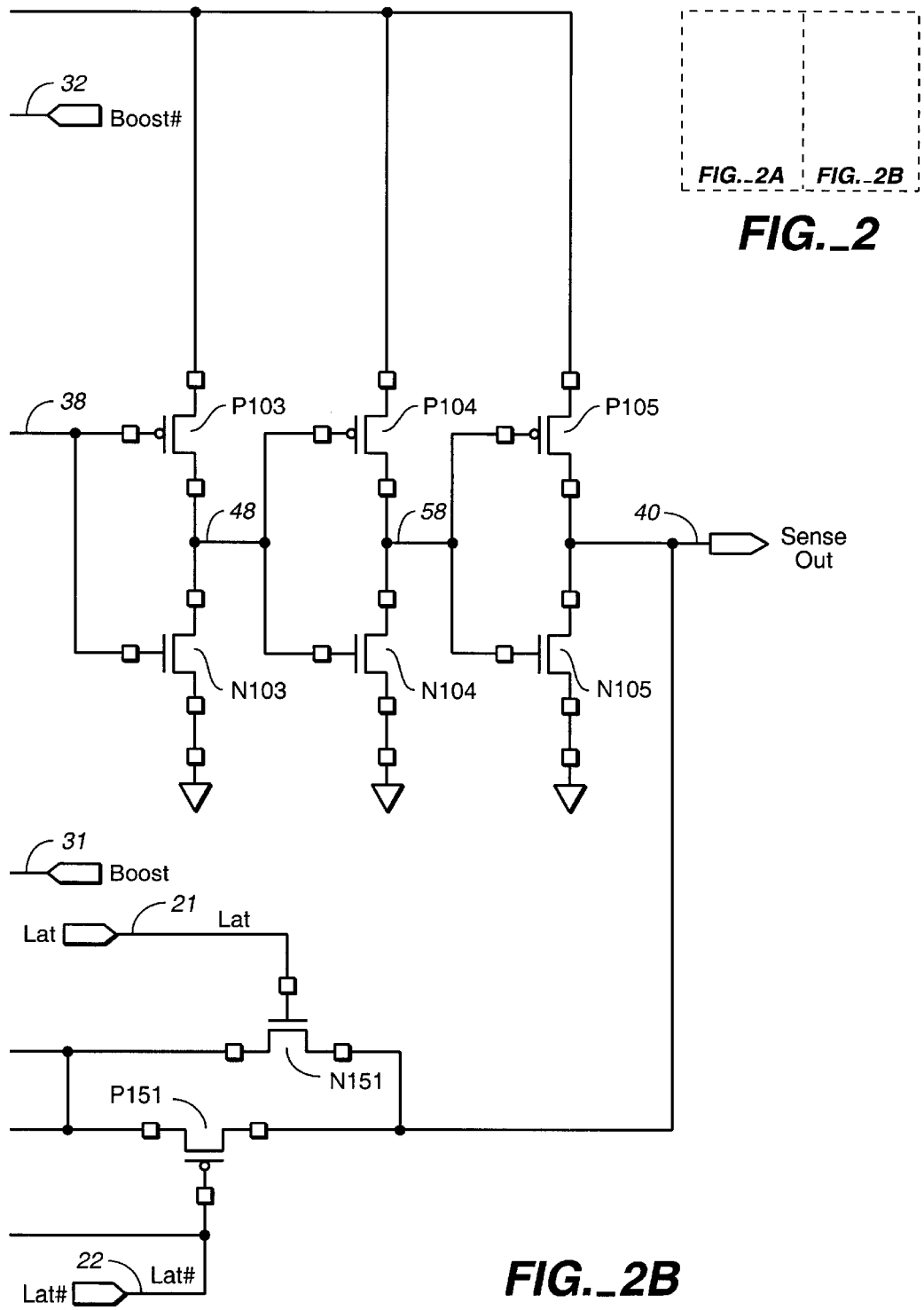

SENSE AMPLIFIER WITH CONFIGURABLE VOLTAGE SWING CONTROL

CROSS REFERENCE TO RELATED APPLICATION

This application is a continuation-in-part of U.S. patent application Ser. No. 09/877,353, filed Jun. 7, 2001 now U.S. Pat. No. 6,518,798.

TECHNICAL FIELD

The present invention relates to sense amplifiers used to sense data in CMOS memory cells, and more specifically, to a latch control circuit within such a sense amplifier.

BACKGROUND ART

In an integrated memory circuit, sense amplifiers are used to improve the speed performance of a memory, and to provide signals which conform with the requirements of driving peripheral circuits within the memory. A sense amplifier is an active circuit that reduces the time of signal propagation from an accessed memory cell to the logic circuit at the periphery of the memory cell array, and converts the arbitrary logic levels occurring on a bitline to the digital logic levels of the peripheral circuits. The sensing part of the sense amplifier detects and determines the data content of a selected memory cell. The sensing may be "nondestructive", wherein the data content of the selected memory cell is unchanged, such as in SRAMs, ROMs and PROMs, or the sensing may be "destructive" wherein the data content of the selected memory cell may be altered by the sense operation, such as in DRAMs.

Many sense amplifiers tend to have a voltage swing on the output. This is because an effective gate voltage on the input of the circuit that is driven by the sense amplifier results in faster output switching times in the driven circuit, but the switching of a greater effective gate voltage and a larger charge on the same load capacitance, with the same output current, requires a longer switching time. In order to improve speed and power performances of sense amplifiers, it is known in the art to limit the amount of voltage swing to a small optimized level. In addition to substantial improvements in speed and power, the reduction of voltage swings becomes critical in designs for deep-submicrometer CMOS technologies. Reduced voltage swings results in a decrease in hot-carrier emissions, cross-talkings, noise, and operation margin degradation. For output voltage swing limitation, the most widely used techniques are the amplitude timing technique and the voltage clamping technique. The amplitude timing technique is implemented by deactivating the sense amplifier at the time point when the voltage swing is at the optimum level. However, this technique may result in large variations of the voltage swing due to device parameter changes. The voltage clamping technique is less prone to device parameter fluctuations.

As the trend towards smaller size memory devices continues, it is desirable to control the voltage swing of the sense amplifiers using the smallest number of transistors possible, and using transistors having a small size, i.e. a small W/L ratio. Additionally, to meet the demand for greater speed, it is desirable for the sense amplifier to operate as fast as possible, while still maintaining a controlled voltage swing.

It is the object of the present invention to provide a sense amplifier having a controlled voltage swing.

It is a further object of the invention to provide a sense amplifier that has a fast operating speed.

It is another object of the invention to provide a sense amplifier that utilizes a minimal number of transistors in the voltage swing control circuit and wherein the transistors used are of a small size.

SUMMARY OF THE INVENTION

The above objects have been achieved by a sense amplifier having a pair of feedback paths between the sense amplifier output and the sense amplifier input for controlling the level of voltage swing on the sense amplifier output. The sense amplifier can be configured to operate in two different operating modes. In a first operating mode, the "turbo" mode, both feedback paths are in operation. The first feedback path includes a transistor without threshold voltage enhancement and having a small W/L ratio in order to create the fastest possible sense operation while the second feedback path contributes stability to control the voltage swing on the sense amplifier output. In the second operating mode, the "non-turbo" mode, only the first feedback path is activated, which provides the maximum swing with a minor decrease in sensing speed. The first operating mode provides a higher margin a swing control, thus higher sensing speed, while the second operating mode allows for greater stability and consumes less power without compromising reliability. The invention allows the user to configure the sense amplifier to provide flexibility in meeting any requirements concerning the speed, operating margin, or power consumption of the sense amplifier.

BRIEF DESCRIPTION OF THE DRAWINGS

FIG. 1 is a block diagram of the sense amplifier of the present invention.

FIG. 2, consisting of FIGS. 2A and 2B, is an electrical schematic diagram of the sense amplifier of the present invention.

BEST MODE FOR CARRYING OUT THE INVENTION

With reference to FIG. 1, a preferred embodiment of the sense amplifier 15 of the present invention includes a sense input node 20 which is connected to a bitline of a memory cell array. An enable signal 30 is supplied to a sensing circuit 35 which is used to detect and determine the data content of the memory cell to which the sense amplifier 15 is connected. The speed of the sensing circuit 35 is set by boost enable signals BOOST 80 and BOOST#82, discussed in further detail in FIG. 2. below, received at the sensing circuit 35. The enable signal 30 is used to control the operation of the sensing circuit. The output 38 of the sensing circuit 35 is supplied to an amplifying circuit 45 which converts the arbitrary voltage level of the bitline to a standard digital logic level which is compatible with any peripheral circuits which are connected to the sense amp output 40. Optionally, one or more buffering circuits 55 may be connected after the amplifying circuit 45 in order to provide a more stable output to the sense amp output node 40. Additionally, a latch control circuit 60 is connected between the sensing circuit input node 67 and the sense amp output 40. The latching function is controlled by latch enable signals LAT 84 and LAT#86, discussed in further detail in FIG. 2, below, which are received at the latch control circuit 60. The sensing circuit 35, amplifying circuit 45, buffering circuit 55 and latch control circuit 60 constitute a latch circuit for storing the voltage value of the sense amplifier output so that the voltage level is held for a longer period of time than the regular memory cycle. Also, by latching the output, the remainder of the sense amplifier can be turned off or idled until it is required to be turned on again. This provides a beneficial result in that a great amount of power can be saved. The output 67 of the latch control circuit 60 is supplied back to the input of the sensing circuit 35. A sense line transistor 50 is connected between the latch control circuit 60 and the sense line input 20 to isolate the sense amp input 20 from the output 67 of the latch circuit.

With reference to FIG. 2, the sensing circuit includes a pair of inverters, the first inverter consisting of transistors P101 and N101 and the second inverter consisting of transistors P102 and N102. Throughout the following description of the sense amplifier circuit, transistors designated with a "P", such as P101 and P102, are p-type MOS transistors, while transistors designated with an "N", such as N101 and N102 are n-type MOS transistors. Transistors P101 and N101 have gate terminals which are connected together to form the input of the sensing circuit and receive the output 67 of the latch circuit. Transistors P102 and N102 form a second inverter having gate terminals electrically connected together and electrically connected to the input of the sensing circuit. The source terminal of transistor P101 is connected to an external voltage source, Vcc, 70 which is the voltage value for the digital logic circuits used at the periphery of the sense amplifier. The source terminal of transistor N101 is connected to a ground potential 80. The outputs of both of the inverters result on a sense line 38.

The second inverter, consisting of P102 and N102, is connected to a pair of boost transistors P121 and N121. Boost transistor P121 is electrically connected between the source terminal of transistor P102 and the external voltage source, Vcc, 70. Boost transistor N121 is electrically connected between the source terminal of transistor N102 and ground 80. Boost transistor P121 receives a first boost enable signal, BOOST#, at its gate terminal 32 and boost transistor N121 receives a second boost enable signal, BOOST, at its gate terminal 31. The boost enable signals, (BOOST, BOOST#), set the sensing speed of the circuit. The second boost enable signal, BOOST, is 180 degrees out of phase with the first boost enable signal BOOST#. A sense enable signal SAEN# is supplied at node 30 to the gate terminal of a sense enable transistor P131.

The sensing circuit also includes a first feedback path consisting of a first feedback transistor N133 having a gate terminal electrically connected to the output of the second inverter (P102, N102), having a drain terminal connected to the drain terminal of the sense enable transistor P131, and having a source terminal electrically connected to the sensing circuit input 67. The sensing circuit also includes a second feedback path including a pair of feedback transistors N132 and N131 connected in series. Transistor N132 has a gate terminal connected to the sense line 38, a drain terminal connected to the drain terminal of transistor P131 and to the drain terminal of transistor N133, and has a source terminal connected to the drain terminal of transistor N131. Transistor N131 has a source connected to the input of the sensing circuit 67 and receives the second boost enable signal, BOOST, at its gate terminal. Transistor N133 is a NMOS transistor that does not have threshold voltage ($V_T$) enhancement, which allows for the proper biasing of the transistor to be set more easily. Transistor N133 has a low W/L ratio and so is of a small size. In general, a higher W/L ratio corresponds to a lower change in the voltage between the gate and source for a given current. Therefore, if the voltage swing is lowered at the same time, then the initial response of the transistor will be slower. Because the W/L ratio of transistor N133 is low, the response time of the transistor will be fast. Transistor N132 is an enhancement transistor placed in the second feedback path in parallel with transistor N133. The transistor N132 operates when the second boost enable signal, BOOST, is "high", turning on the switch transistor N131, to the second feedback path. In operation, transistor N132 would only contribute current when the voltage difference between the bitline and the sense output line is close to its threshold voltage. The effect of this is that transistor N133 operates with an initial fast response and then the transistor N132 contributes current to the column as the voltage approaches the threshold voltage, serving to control the voltage swing.

The sense amplifier of the present invention also includes an amplifying circuit having an inverter consisting of transistors P103 and N103. Transistor P103 has a gate terminal connected to the sense line 38, a source terminal connected to voltage source Vcc 70, and a drain terminal connected to the drain terminal of transistor N103. Transistor N103 has a source terminal connected to ground 80 and a gate terminal connected to the sense line 38. The output of the inverter (P103, N103) goes to a sense output line 48.

Optionally buffering circuits can be added to the sense amplifier. The buffering circuits shown in FIG. 2 are a pair of inverters, one buffer inverter consisting of transistors P104 and N104, and a second buffer inverter consisting of transistors P105 and N105. The first inverter (P104, N104) receives an input from the output 48 of inverter P103, N103. Both inverters have the source terminals of the p-type transistor (P104, P105) connected to the voltage source Vcc and the source terminals of the n-type transistor (N104, N105) connected to ground. The output 58 of the first inverter (P104, N104) is provided to the gate terminal inputs of the second inverter (P105, N105). The output of the second inverter (P105, N105) is provided to the sense amp output node 40.

A latch control circuit consisting of transistors P151 and N151 is connected between the sense amplifier output 40 and the sensing circuit input 67. The latch control circuit (P151, N151) receives latch enable signals Lat and Lat# in order to control the latching function. Transistor N151 has a drain terminal connected to the sense amp output node 40, a gate terminal connected to a node 21 which receives a latch signal Lat, and a source terminal electrically connected to the sensing circuit input 67. Transistor P151 has a drain terminal electrically connected to the sensing circuit input 67 and has a gate terminal electrically connected to a node 22 which receives the latch signal Lat#.

The sense line transistor N134 is connected between the output 67 of the latch and the sense amplifier input 20. The sense line transistor N134 has a source terminal connected to the sense line input 20, a drain terminal connected to the latch output 67 and a gate terminal electrically connected to the node 22 receiving the latch signal, Lat#. The sense line transistor N134 serves to prevent the voltage of the output signal stored in the latch from dropping or glitching due to the impedance of the bitline connected to the sense amp input 20. For example, if the output at output node 40 is at a voltage represented by a logic level 1, the impedance of the sense amp input line 20 could possibly lower the voltage on the output node to a voltage level near the switching threshold voltage of the latch. This would create an unstable situation, a transient glitch, which could affect the value of the voltage stored in the latch. The transistor N134 operates to pull up the voltage on the output and serves to isolate the output of the latch from the input line in order to prevent these transients that could affect the reading of the memory cell.

The sense amplifier operates as follows. First, the sense enable signal SAEN# and the latch signals Lat, Lat# set the circuit in either the active read or the latch configuration. For reading, the SAEN# signal is a logic level low, the latch signal Lat is low and the latch signal Lat# is high. For latch operation, the SAEN# signal is high, the latch signal Lat is high and the latch signal Lat# is low. Proper timing for the above signals is provided in order to ensure smooth transition from read to latch operation. The BOOST and BOOST# signals serve to set the sensing speed of the circuit. When in the "boost high" read mode, faster sensing is achieved at the expense of high power consumption. Alternatively, the signals can operate at a slower speed, "boost low" mode, in order to conserve power. When reading with the BOOST signal high (BOOST# low), the inverters (P101, N101) and (P102, N102) control the feedback transistors N132 and N131, providing a precharge, regulation and first stage sensing for the bitline connected to the sense input node 20. A voltage difference proportional to a first current flowing through sense line transistor N134 forms across the sense line 38 and sense latch 67 nodes. If the first current is greater than or equal to the specified minimum detection level, then the sense node voltage drives the output of inverter P103 and N103 to a low state. Otherwise, the output of the amplifying inverter P103, N103 stays in a high state. During the read operation, the voltage of the sense latch node 67 is at a precharge level, hence causing the two inverters (P101, N101), and (P102, N102) to burn a static current. When reading in the "boost low" mode (boost# high), the operation is the same as above, except that the inverter consisting of transistors P102 and N102, and the feedback device N132, have been disabled. In this configuration, the sense node has more voltage swing, providing more stability and consuming less power in the circuit.

In the latch mode of operation, latching the state of the sense amp output node 40 provides a way of reducing the power consumption of the circuit to a zero level. The latch signal, Lat, goes from low to high, the latch signal, Lat#, goes from high to low, and the sense enable signal, SAEN#, goes from low to high. This allows the voltage held in the sense amp output node 40 to be transferred into the sense latch node 67 while the sense amp input 20 is isolated. The generally high capacitive sense amp input node 20 does not have to be charged or discharged by the output drivers P105, N105 due to the sense line transistor N134 isolating it. This allows for a faster, safer and greater power saving latch configuration.

It is understood that changes may be made to the embodiment described above without departing from the broad inventive concepts thereof. Accordingly, the present invention is not limited to the particular embodiments disclosed, but is intended to cover all modifications that are within the spirit and scope of the invention as defined by the appended claims.

What is claimed is:

1. A sense amplifier comprising:
    a) a sense amp input node for receiving a data signal from a bitline of a memory cell;
    b) an output node for producing a sense amplifier output signal; and
    c) a latch circuit for latching the sense amplifier output signal having:
        i) an enable signal input node for receiving an enable signal;
        ii) a sensing circuit electrically coupled between the sense amp input node and the output node and also electrically coupled to the enable signal input node, the sensing circuit having a sensing circuit input to receive the data signal from a sense latch node and receiving the enable signal from the enable signal input node and producing a sensing circuit output signal indirectly coupled to the output node producing the sense amplifier output signal, the sensing circuit including a first inverter and a second inverter connected in parallel, an input of the first inverter being electrically connected to the sense latch node and an output of the second inverter being electrically connected to the output node;
        iii) a first feedback path including a first feedback transistor electrically connected to the output of the second inverter and the sense latch node; and
        iv) a second feedback path including a second feedback transistor and a third feedback transistor connected in series, the second feedback transistor having a gate terminal connected to the output of the second inverter, having a drain terminal connected to the first feedback transistor and having a source terminal connected to the third feedback transistor, the third feedback transistor being connected to the sense latch node and receiving a boost enable signal at a gate terminal.

2. The sense amplifier of claim 1 wherein each of the first and the second inverter of the sensing circuit consists of a p-type transistor and an n-type transistor having gates electrically connected to form an inverter input.

3. The sense amplifier of claim 2 wherein the sensing circuit further includes: a first and second boost transistor, each connected
    to the second inverter, the first boost transistor being a p-type transistor receiving an inverted boost enable signal at a gate terminal and having a drain terminal electrically connected to a source terminal of the p-type transistor of the second inverter and having a source terminal connected to a voltage source, the second boost transistor being an n-type transistor receiving the boost enable signal at a gate terminal and having a drain terminal electrically connected to a source terminal of the n-type transistor of the second inverter and having a source terminal connected to a ground potential; and
    a sense enable transistor receiving the enable signal at a gate terminal, and having a drain terminal electrically connected to the first and second feedback paths and a source terminal electrically connected to the voltage source.

4. The sense amplifier of claim 3 wherein the first feedback transistor has a gate terminal electrically connected to the output of the second inverter, a drain terminal electrically connected to the drain terminal of the sense enable transistor and a source terminal electrically connected to the sense latch node.

5. The sense amplifier of claim 4 wherein the third feedback transistor has a source terminal connected to the sense latch node.

6. The sense amplifier of claim 1 wherein the latch circuit further comprises:
    an amplifying circuit electrically connected between the sensing circuit and the output node.

7. The sense amplifier of claim 6 wherein the latch circuit further comprises:
    at least one buffering circuit electrically connected between the amplifying circuit and the output node.

8. The sense amplifier of claim 1 wherein the latch circuit further comprises:
    a latching control circuit electrically connected between the output node and the sense latch node.

9. The sense amplifier of claim 8 wherein the latching control circuit includes a first and second latch node for receiving a first latch control signal and a second latch control signal, said first latch control signal being in phase with the enable signal and said second control latch signal being out of phase with respect to the enable signal.

10. The sense amplifier of claim 9 wherein the latching control circuit comprises a p-channel transistor and a n-channel transistor electrically connected in parallel and each having a gate, and being electrically connected between the sense latch node and the output node, the n-channel transistor receiving the first latch control signal at its gate and the p-channel transistor receiving the second latch control signal at its gate.

11. The sense amplifier circuit of claim 6 wherein the amplifying circuit includes an amplifying inverter having a p-type transistor and an n-type transistor, each having a gate terminal, said gate terminals being electrically connected to each other and to the output of the sensing circuit, said p-type transistor having a source terminal electrically connected to a voltage source and a drain terminal electrically connected to the output node, said n-type transistor having a source terminal connected to a ground potential and having a drain terminal connected to the output node.

12. The sense amplifier of claim 7 wherein the at least one buffering circuit is an inverter.

13. The sense amplifier of claim 1 wherein the second feedback transistor is an enhancement-type MOSFET.

14. The sense amplifier of claim 1 wherein the first feedback transistor is a non-enhancement type MOSFET.

15. A sense amplifier comprising:
a) a sense amp input node for receiving a data signal from a bitline of a memory cell;
b) an output node for producing a sense amplifier output signal; and
c) a latch circuit for latching the sense amplifier output signal having:
   i) an enable signal input node for receiving an enable signal;
   ii) a sensing circuit electrically coupled between the sense amp input node and the output node and also electrically coupled to the enable signal input node, the sensing circuit having a sensing circuit input to receive the data signal from a sense latch node and receiving the enable signal from the enable signal input node and producing a sensing circuit output signal indirectly coupled to the output node producing the sense amplifier output signal, the sensing circuit including a first inverter and a second inverter connected in parallel, an input of the first inverter being electrically connected to the sense latch node and an output of the second inverter being electrically connected to a sense line;
   iii) a first feedback path including a first feedback transistor having a gate terminal electrically connected to the output of the second inverter, a drain terminal electrically connected to a drain terminal of a sense enable transistor and a source terminal electrically connected to the sense latch node; and
   iv) a second feedback path including a second feedback transistor and a third feedback transistor connected in series, the second feedback transistor having a gate terminal connected to the output of the second inverter, having a drain terminal connected to the first feedback transistor and having a source terminal connected to the third feedback transistor, the third feedback transistor having a source terminal connected to the sense latch node and receives a boost enable signal at a gate terminal.

16. The sense amplifier of claim 15 wherein each of the first inverter and the second inverter of the sensing circuit consists of a p-type transistor and an n-type transistor having gates electrically connected to form an inverter input.

17. The sense amplifier of claim 16 wherein the sensing circuit further includes:
a first and second boost transistor, each connected to the second inverter, the first boost transistor being a p-type transistor receiving an inverted boost enable signal at a gate terminal and having a drain terminal electrically connected to a source terminal of the p-type transistor of the second inverter and having a source terminal connected to a voltage source, the second boost transistor being an n-type transistor receiving the boost enable signal at a gate terminal and having a drain terminal electrically connected to a source terminal of the n-type transistor of the second inverter and having a source terminal connected to a ground potential; and
the sense enable transistor receiving the enable signal at a gate terminal, and having the drain terminal electrically connected to the first and second feedback paths and a source terminal electrically connected to the voltage source.

18. The sense amplifier of claim 15 wherein the latch circuit further comprises:
an amplifying circuit electrically connected between the sensing circuit and the output node.

19. The sense amplifier of claim 18 wherein the latch circuit further comprises:
at least one buffering circuit electrically connected between the amplifying circuit and the output node.

20. The sense amplifier of claim 15 wherein the latch circuit further comprises:
a latching control circuit electrically connected between the output node and the sense latch node.

21. The sense amplifier of claim 20 wherein the latching control circuit includes a first and second latch node for receiving a first latch control signal and a second latch control signal, said first latch control signal being in phase with the enable signal and said second control latch signal being out of phase with respect to the enable signal.

22. The sense amplifier of claim 21 wherein the latching control circuit comprises a p-channel transistor and a n-channel transistor electrically connected in parallel and each having a gate, and being electrically connected between the drain of the sense line transistor and the output node, the n-channel transistor receiving the first latch control signal at its gate and the p-channel transistor receiving the second latch control signal at its gate.

23. The sense amplifier circuit of claim 18 wherein the amplifying circuit includes an amplifying inverter having a p-type transistor and an n-type transistor, each having a gate terminal, said gate terminals being electrically connected to each other and to the output of the sensing circuit, said p-type transistor having a source terminal electrically connected to a voltage source and a drain terminal electrically connected to the output node, said n-type transistor having a source terminal connected to a ground potential and having a drain terminal connected to the output node.

* * * * *